(12) United States Patent
Zhao et al.

(10) Patent No.: US 12,416,667 B2
(45) Date of Patent: Sep. 16, 2025

(54) ADAPTIVE THERMAL CALIBRATION FOR THROTTLING PREVENTION

(71) Applicant: Innogrit Technologies Co., Ltd., Shanghai (CN)

(72) Inventors: Gang Zhao, Chandler, AZ (US); Lin Chen, Cupertino, CA (US); Wei Jiang, Fremont, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 478 days.

(21) Appl. No.: 17/492,563

(22) Filed: Oct. 2, 2021

(65) Prior Publication Data

US 2023/0106101 A1 Apr. 6, 2023

(51) Int. Cl.
 *G01R 31/28* (2006.01)
 *G06F 1/08* (2006.01)
 *G11C 5/14* (2006.01)

(52) U.S. Cl.
 CPC .......... *G01R 31/2891* (2013.01); *G06F 1/08* (2013.01); *G11C 5/14* (2013.01)

(58) Field of Classification Search
 CPC ...... G06F 1/206; G06F 3/0653; G06F 3/0679; G06F 1/08; Y02D 10/00; G01R 31/2891
 See application file for complete search history.

(56) References Cited

U.S. PATENT DOCUMENTS

| | | | |
|---|---|---|---|
| 9,760,311 B1* | 9/2017 | Amir | G06F 1/3275 |
| 10,379,739 B1* | 8/2019 | Bazarsky | G11C 11/5642 |
| 10,854,261 B1* | 12/2020 | Ghosh | G11C 11/1659 |
| 11,093,135 B1* | 8/2021 | Ali | G06F 1/3206 |
| 11,112,811 B2* | 9/2021 | Hunt-Schroeder | G11C 29/021 |
| 11,321,008 B2* | 5/2022 | Mayer | G06F 3/0653 |
| 11,355,165 B2* | 6/2022 | Porter | G11C 7/04 |
| 11,482,989 B2* | 10/2022 | Gans | H03H 11/28 |
| 11,726,721 B2* | 8/2023 | Moon | G11C 7/04 365/194 |
| 2007/0018715 A1* | 1/2007 | Herbert | G11C 7/225 327/540 |
| 2008/0001634 A1* | 1/2008 | Arabi | G06F 9/3885 326/99 |
| 2011/0055603 A1* | 3/2011 | Wolfe | G06F 1/3296 713/320 |

(Continued)

*Primary Examiner* — Vincent H Tran

(74) *Attorney, Agent, or Firm* — IPro, PLLC

(57) ABSTRACT

Systems, apparatus and methods are provided for selecting a performance profile for a storage system. A method may include: generating a set of performance profiles for a non-volatile storage system, performing a thermal calibration by running a first test under a first performance profile and a second test under a second performance profile, obtaining a first maximum temperature under the first performance profile and a second maximum temperature under the second performance profile, selecting an optimal performance profile from the set of performance profiles based on comparing the first maximum temperature and the second maximum temperature to a predetermined threshold value and operating the non-volatile storage system under the optimal performance profile. Each of the set of performance profiles may include settings for hardware components of the non-volatile storage system.

22 Claims, 2 Drawing Sheets

(56) References Cited

U.S. PATENT DOCUMENTS

| | | | |
|---|---|---|---|
| 2014/0359196 A1* | 12/2014 | Ragland | G06F 13/385 |
| | | | 711/102 |
| 2015/0092488 A1* | 4/2015 | Wakchaure | G11C 16/26 |
| | | | 365/185.18 |
| 2016/0124475 A1* | 5/2016 | Chandra | G06F 1/206 |
| | | | 700/300 |
| 2017/0046097 A1* | 2/2017 | Jayaraman | G06F 3/0614 |
| 2018/0046231 A1* | 2/2018 | Raghu | G06F 3/0653 |
| 2019/0073154 A1* | 3/2019 | Gwin | G06F 3/0679 |
| 2020/0073568 A1* | 3/2020 | Chaiken | G11C 29/021 |
| 2020/0326736 A1* | 10/2020 | Yeh | G05D 23/1931 |
| 2020/0333976 A1* | 10/2020 | Cariello | G06F 11/3034 |
| 2020/0348884 A1* | 11/2020 | Boenapalli | G06F 3/0679 |
| 2021/0081109 A1* | 3/2021 | Wang | G11C 29/028 |
| 2021/0109562 A1* | 4/2021 | Ragland | G06F 16/9035 |
| 2021/0165442 A1* | 6/2021 | Jung | G06F 1/3215 |
| 2022/0004475 A1* | 1/2022 | Benoit | G05B 13/0265 |
| 2022/0314671 A1* | 10/2022 | Hoga | B41J 29/38 |
| 2023/0004310 A1* | 1/2023 | Kondo | G11C 16/22 |
| 2023/0071918 A1* | 3/2023 | Park | G06F 1/3296 |

* cited by examiner

ADAPTIVE THERMAL CALIBRATION FOR THROTTLING PREVENTION

TECHNICAL FIELD

The disclosure herein relates to the solid state storage device management, particularly relates to thermal management for solid state storage devices.

BACKGROUND

Thermal throttling is widely adopted in modern electronics system for prevention of overheating. To perform thermal throttling, a processor typically slows down its clock frequencies and command throughputs to keep the temperature in check. As a result, thermal throttling often comes with undesirable performance degradation noticeable to the end users.

In modern solid state drives (SSD), thermal throttling has also become widely used as the heat generation in the SSDs has greatly outpaced the heat dissipation. This is because that the SSDs have been developed to higher speed and higher performance while its physical size and heat dissipation capacity have been remained largely the same. Thermal throttling has thereby become a necessary part of the SSD system solutions in order to prevent overheating which may risk causing data loss or component damages.

SUMMARY

The present disclosure provides a storage system and a method to conduct thermal calibration and adapt to the system thermal environment. A set of performance profiles may be created with distinct performance milestones from low performance to full performance. For each performance profile, a thermal calibration may be conducted and a maximum temperature for that performance profile may be recorded. For example, a first thermal calibration with one performance profile may be conducted to record a first maximum temperature. And a second thermal calibration with a second performance profile may be conducted to record a second maximum temperature. Based on the calibration results, during operation, one performance profile may be selected to minimize the probability of entering thermal throttling. The adaptive thermal calibration may be performed during initialization of the storage system and subsequently when the environment temperature change exceeds a certain threshold, or the number of thermal throttling events in a given time interval has exceeded a threshold value.

In one exemplary embodiment, there is provided a method that may comprise: generating a set of performance profiles for a non-volatile storage system, performing a thermal calibration by running a first test under a first performance profile and a second test under a second performance profile, obtaining a first maximum temperature under the first performance profile and a second maximum temperature under the second performance profile, selecting an optimal performance profile from the set of performance profiles based on comparing the first maximum temperature and the second maximum temperature to a predetermined threshold value and operating the non-volatile storage system under the optimal performance profile. Each of the set of performance profiles may include settings for hardware components of the non-volatile storage system.

In another embodiment, there is provided a non-volatile storage system that may comprise a storage controller and a temperature sensor. The storage controller may be configured to: generate a set of performance profiles, perform a thermal calibration by running a first test under a first performance profile and a second test under a second performance profile, obtain a first maximum temperature under the first performance profile and a second maximum temperature under the second performance profile from readings of the temperature sensor, select an optimal performance profile from the set of performance profiles based on comparing the first maximum temperature and the second maximum temperature to a predetermined temperature threshold value and operate the non-volatile storage system under the optimal performance profile. Each of the set of performance profiles may include settings for hardware components of the non-volatile storage system.

In yet another exemplary embodiment, disclosed herein may also include a non-transitory machine-readable medium having executable instructions. The executable instructions, when executed by a storage controller of a non-volatile storage system, may cause the storage controller to: generate a set of performance profiles, perform a thermal calibration by running a first test under a first performance profile and a second test under a second performance profile, obtain a first maximum temperature under the first performance profile and a second maximum temperature under the second performance profile from readings of a temperature sensor of the non-volatile storage system, select an optimal performance profile from the set of performance profiles based on comparing the first maximum temperature and the second maximum temperature to a predetermined temperature threshold value, and operate the non-volatile storage system under the optimal performance profile. Each of the set of performance profiles may include settings for hardware components of the non-volatile storage system.

DETAILED DESCRIPTION

Figure 1:
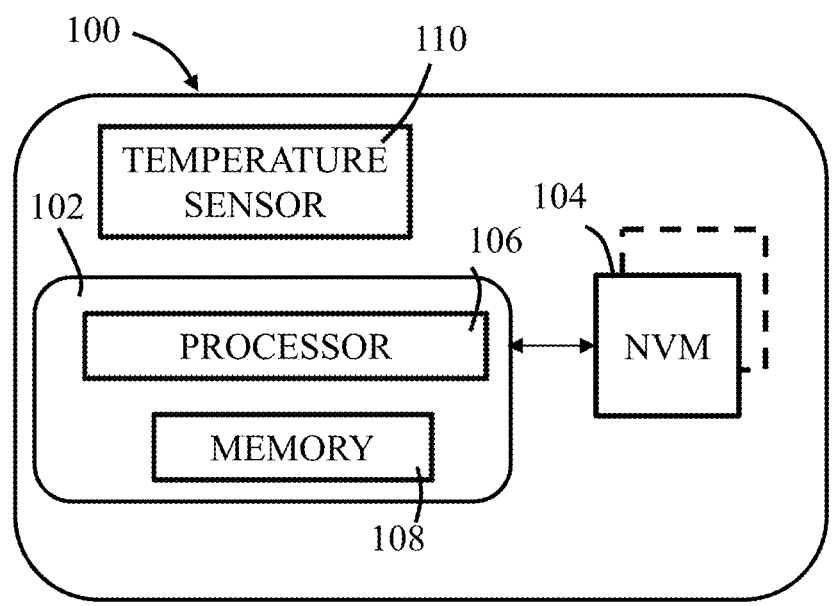
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides methods of thermal calibration to prevent or minimize the occurrences of thermal throttling for solid state drives. As used herein, a non-volatile memory device may be a computer storage device that can maintain stored information after being powered off, and the stored information may be retrieved after being power cycled (turned off and back on). Non-volatile storage devices may include NAND flash memories, NOR flash memories, magnetoresistive random Access Memory (MRAM), resistive random access memory (RRAM), phase change random access memory (PCRAM), Nano-RAM, etc. In the description, a NAND flash may be used as an example to demonstrate the controller implemented electrical mirroring techniques. However, various embodiments according to the present disclosure may implement the techniques with other types of non-volatile storage devices.

FIG. 1 schematically shows a non-volatile storage system 100 in accordance with an embodiment of the present disclosure. The non-volatile storage system 100 may comprise a storage controller 102 and a non-volatile storage device 104. The non-volatile storage system 100 may provide data storage and/or access to stored data to a host when it is coupled to the host via an interface (e.g., Peripheral Component Interconnect Express (PCIe) interface). The non-volatile storage device 104 may be a non-volatile memory (NVM), for example, a NAND device. The storage controller 102 may be coupled to the non-volatile storage device 104 via a host interface, for example, NAND interface. It should be noted that the non-volatile storage system 100 may comprise a plurality of non-volatile storage devices and the non-volatile storage device 104 may be shown as a representative for the plurality of non-volatile storage devices. In an embodiment, the non-volatile storage system 100 may be a solid state drive (SSD).

The storage controller 102 may comprise a processor 106, a non-transitory computer-readable storage media 108. The processor 106 may be a computer processor, such as, but not limited to, a microprocessor or a microcontroller. The non-transitory computer-readable storage media 108 may be referred to as a memory, and may store software that may be executed by the processor 106 to perform throttling prevention techniques in accordance with the disclosure. The storage controller 102 may be coupled to the non-transitory computer-readable storage media 108 by a memory interface, e.g., a DRAM interface.

The non-volatile storage system 100 may include a temperature sensor 110. The temperature sensor 110 may provide read-outs for temperatures. It should be noted the non-volatile storage system 100 may include more than one temperature sensor, and temperature readings from any or all temperature sensors may be used for throttling prevention.

The storage controller 102 may control many hardware components' settings of the non-volatile storage system 100, for example, processor clock frequency, host interface clock frequency, NAND interface clock frequency, memory interface clock frequency, as well as driver strengths and termination settings for individual interfaces. Under these settings, the non-volatile storage system 100 may have different thermal characteristics and also different performances. One set of settings for the hardware components may be referred to as a performance profile.

Different performance profiles may represent distinct performance milestones and thermal characteristics. For example, a performance profile with settings for higher clock frequencies, stronger driver strengths and lower termination resistance may be referred to as a higher performance profile compared to another performance profile with settings for slower clock frequencies, weaker driver strengths and higher termination resistance. And a higher performance profile may provide faster read/write speed than a lower performance profile. In at least one embodiment, the settings included in a performance profile may also include voltage settings. A lower voltage in a performance profile may save power and reduce heat dissipation compared to a higher voltage in another performance profile.

In some embodiments, a set of performance profiles may be constructed based on common system performance benchmarks. For non-volatile storage systems (e.g., SSDs), common system performance benchmarks may include sequential read and sequential write. For example, the performance profiles may be created for sequential read performance at 1 GB/s, 2 GB/s, . . . , to 8 GB/s, with an interval of 1 GB/s. Thus, a total of 8 performance profiles may be created with different settings of clock frequencies, driver strength and termination settings.

The non-volatile storage system 100 may work in different environments and the environment may affect the temperature of the non-volatile storage system 100. To prevent the occurrences of thermal throttling or minimize the probability of thermal throttling, thermal calibration may be performed and one of the set of performance profiles may be selected based on thermal calibration result. The selected performance profile may be referred to as an optimal performance profile or performance profile selected for operation. For example, two or more different performance profiles may be tested by the non-volatile storage system 100 in a thermal calibration during initialization of the non-volatile storage system 100. In one embodiment, a low performance profile may be chosen as the first performance profile for a first system test. A high performance profile may be chosen as the second performance profile for a second system test. Based on temperatures reached under each performance profile tested, the optimal performance profile may be selected.

It should be noted that the selected optimal performance profile does not need to be one of the performance profiles tested during the thermal calibration. For example, the non-volatile storage system 100 may be configured with eight performance profiles for sequential read performance at 1 GB/s, 2 GB/s, . . . , to 8 GB/s, with an interval of 1 GB/s. During a thermal calibration, performance profiles for sequential read performance at 2 GB/s and 5 GB/s may be tested, and based on the test result, one of the eight performance profiles may be selected for the non-volatile storage system 100.

In some embodiments, a thermal calibration may be performed during initialization of the non-volatile storage system 100. In addition, or alternatively, a thermal calibration may be performed when one or more conditions are met. For example, in an embodiment, the environment temperature and the occurrences of thermal throttling may be continuously monitored and thermal calibration may be performed when thermal throttling occurs or the temperature reading reaches a predetermined temperature threshold. In one embodiment, a predetermined number of occurrences of thermal throttling during a given period of time or one occurrence of thermal throttling at any time may trigger a thermal calibration. The predetermined number of occurrences of thermal throttling and the length of the period of time may be determined by experiments, and may be different for different NVMs (e.g., different brands, different types of NVMs (SLC, TLC, QLC, etc.)). Moreover, the reading from the temperature sensor 110 reaching a predetermined temperature threshold may also trigger a thermal calibration.

The predetermined temperature threshold may be set depending on the location of the temperature sensor 110. For example, if the temperature sensor 110 may be in the non-volatile storage system 100 but off the controller 120 (e.g., on the NVM 104), the predetermined temperature threshold may be set to 85° C. If the temperature sensor 110 is located on the controller 102, the predetermined temperature threshold may be set to 105° C. If an embodiment of the non-volatile storage system 100 has more than one temperature sensor, each temperature sensor's reading may be compared to its own predetermined temperature threshold. For example, if an embodiment of the non-volatile storage system 100 has two temperature sensors 110, one on the NVM 104 and one on the controller 102, then a thermal calibration may be triggered if either temperature sensors' reading reaches its respective predetermined temperature threshold.

In some embodiment, the optimal performance profile may be selected by comparing the maximum temperatures generated by system tests under different performance profiles to a predefined temperature threshold. For example, if a low performance profile and a high performance profile are tested in a thermal calibration, a first and a second maximum temperatures under these two performance profiles may be obtained. The optimal performance profile may be selected in a way that its projected maximum temperature is the closest to the temperature threshold among the set of performance profiles but not greater than it.

The projected maximum temperature may be obtained through interpolation or extrapolation of the first and second maximum temperature readings. For example, if the first maximum temperature is smaller than the temperature threshold and the second maximum temperature is greater than the temperature threshold, the optimal performance profile may have a projected maximum temperature in between of the first and the second maximum temperatures. If both the first and second maximum temperature are higher than the temperature threshold, the optimal performance profile may be a lower performance profile (e.g., slower sequential read) than both the first and second performance profiles. If both the first and second maximum temperature are lower than the temperature threshold, the optimal performance profile may be a higher performance profile than both the first and second performance profiles (e.g., faster sequential read). In one embodiment, the maximum temperatures may be obtained when the readouts of the temperature sensor 110 reach a maximum and stabilize at a saturated value for each of the tested performance profiles. This may happen after running a test for a period of time and the heat generation and dissipation for the non-volatile storage system 100 has reached an equilibrium state. It should be noted that more than two performance profiles may be tested in a thermal calibration and the optimal performance profile may be selected based on the maximum temperatures generated under all performance profiles tested, including interpolation or extrapolation.

Figure 2:
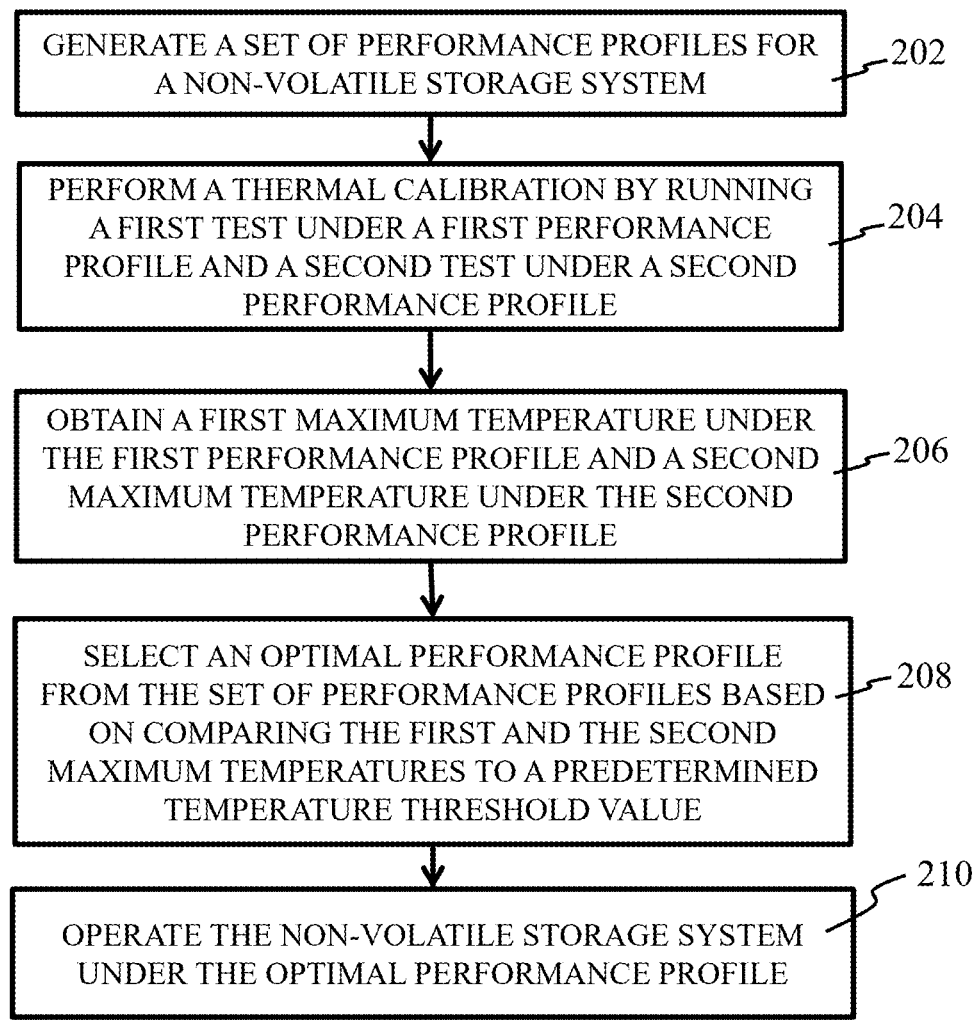
FIG. 2 is a flowchart of a process for selecting a performance profile for a non-volatile storage system in accordance with an embodiment of the present disclosure.

FIG. 2 is a flowchart of a process 200 for selecting a performance profile for a non-volatile storage system in accordance with an embodiment of the present disclosure. At block 202, a set of performance profiles may be generated for a non-volatile storage system. For example, based on a common system performance benchmark, such as sequential read or sequential write, a plurality of performance profiles may be generated. Each performance profile may include settings for hardware components of the non-volatile storage system, for example, clock frequencies, driver strength and termination settings. In some embodiments, the settings for hardware components may also include voltage settings. Each performance profile may have different thermal characteristics and different performance (e.g., faster vs. slower read/write)

At block 204, a thermal calibration may be performed by running a first test under a first performance profile and a second test under a second performance profile. In some embodiments, the non-volatile storage system 100 may perform tests under a few performance profiles in a thermal calibration. The thermal calibration may include testing of at least two performance profiles with different thermal and performance characteristics. For example, the first performance profile may be for a sequential read speed of 2 GB/s and the second performance profile may be for a sequential read speed of 5 GB/s.

At block 206, a first maximum temperature under the first performance profile and a second maximum temperature under the second performance profile may be obtained. In some embodiments, the maximum temperatures may be obtained when the readouts of the temperature sensor 110 reach a maximum and stabilize at a saturated value for each of the tested performance profiles.

At block 208, an optimal performance profile may be selected from the set of performance profiles based on comparing the first maximum temperature and the second maximum temperature to a predetermined temperature threshold value. For example, the optimal performance profile may be selected in a way that its projected maximum temperature is the closest to the temperature threshold among the set of performance profiles but not greater than it. In some embodiments, a predetermined temperature threshold value may depend on the position of the temperature sensor (e.g., 105° C. if the sensor is on the controller 102, 85° C. if elsewhere). At block 210, the non-volatile storage system may be operated under the optimal performance profile. In some embodiments, the environment temperature may be monitored and another thermal calibration may be triggered if the environment temperature changes exceed a threshold. Also, occurrences of thermal throttling may also be monitored. In one embodiment, one occurrence of thermal throttling may trigger another thermal calibration. In another embodiment, the number of occurrences of thermal throttling in a given time period may trigger another thermal calibration.

In one exemplary embodiment, there is provided a method that may comprise: generating a set of performance profiles for a non-volatile storage system, performing a thermal calibration by running a first test under a first performance profile and a second test under a second performance profile, obtaining a first maximum temperature under the first performance profile and a second maximum temperature under the second performance profile, selecting an optimal performance profile from the set of performance profiles based on comparing the first maximum temperature and the second maximum temperature to a predetermined temperature threshold value and operating the non-volatile storage system under the optimal performance profile. Each of the set of performance profiles may include settings for hardware components of the non-volatile storage system.

In one embodiment, the optimal performance profile may have a projected maximum temperature that is closest to the predetermined temperature threshold value but not greater than the predetermined temperature threshold value.

In one embodiment, the projected maximum temperature may be obtained through interpolation or extrapolation of the first and second maximum temperatures.

In one embodiment, the set of performance profiles may have different performance levels based on a common system performance benchmark.

In one embodiment, the common system performance benchmark may be sequential read or sequential write, and the different performance levels may be different speeds.

In one embodiment, the first performance profile may have hardware component settings for a low performance level and the second performance profile may have hardware component settings for a high performance level.

In one embodiment, the first and second maximum temperatures may be obtained by a temperature sensor of the non-volatile storage system not located on a storage system controller, and the predefined temperature threshold may be 85° C.

In one embodiment, the first and second maximum temperatures may be obtained by a temperature sensor of the non-volatile storage system located on a storage system controller, and the predefined temperature threshold may be 105° C.

In one embodiment, the thermal calibration may be performed during initialization of the non-volatile storage system.

In one embodiment, the thermal calibration may be triggered by a temperature reading of the non-volatile storage system reaching the predetermined temperature threshold value, or one occurrence of thermal throttling, or a predetermined number of occurrences of thermal throttling during a given period of time.

In another embodiment, there is provided a non-volatile storage system that may comprise a storage controller and a temperature sensor. The storage controller may be configured to: generate a set of performance profiles, perform a thermal calibration by running a first test under a first performance profile and a second test under a second performance profile, obtain a first maximum temperature under the first performance profile and a second maximum temperature under the second performance profile from readings of the temperature sensor, select an optimal performance profile from the set of performance profiles based on comparing the first maximum temperature and the second maximum temperature to a predetermined temperature threshold value and operate the non-volatile storage system under the optimal performance profile. Each of the set of performance profiles may include settings for hardware components of the non-volatile storage system.

In one embodiment, the optimal performance profile may have a projected maximum temperature that is closest to the predetermined temperature threshold value but not greater than the predetermined temperature threshold value.

In one embodiment, the projected maximum temperature may be obtained through interpolation or extrapolation of the first and second maximum temperatures.

In one embodiment, the set of performance profiles may have different performance levels based on a common system performance benchmark.

In one embodiment, the common system performance benchmark may be sequential read or sequential write, and the different performance levels may be different speeds.

In one embodiment, the first performance profile may have hardware component settings for a low performance level and the second performance profile may have hardware component settings for a high performance level.

In one embodiment, the temperature sensor of the non-volatile storage system may be located off the storage system controller, and the predefined temperature threshold may be 85° C.

In one embodiment, the temperature sensor may be located on the storage controller, and the predefined temperature threshold may be 105° C.

In one embodiment, the thermal calibration may be triggered by a temperature reading of the non-volatile storage system reaching the predetermined temperature threshold value, or one occurrence of thermal throttling, or a predetermined number of occurrences of thermal throttling during a given period of time.

In yet another exemplary embodiment, disclosed herein may also include a non-transitory machine-readable medium having executable instructions. The executable instructions, when executed by a storage controller of a non-volatile storage system, may cause the storage controller to: generate a set of performance profiles, perform a thermal calibration by running a first test under a first performance profile and a second test under a second performance profile, obtain a first maximum temperature under the first performance profile and a second maximum temperature under the second performance profile from readings of a temperature sensor of the non-volatile storage system, select an optimal performance profile from the set of performance profiles based on comparing the first maximum temperature and the second maximum temperature to a predetermined temperature threshold value, and operate the non-volatile storage system under the optimal performance profile. Each of the set of performance profiles may include settings for hardware components of the non-volatile storage system.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
    generating a set of performance profiles for a non-volatile storage system, each of the set of performance profiles including settings for hardware components of the non-volatile storage system;
    performing a thermal calibration by running a first test under a first performance profile and a second test under a second performance profile;
    obtaining a first maximum temperature under the first performance profile and a second maximum temperature under the second performance profile;
    selecting an optimal performance profile from the set of performance profiles based on comparing the first maximum temperature and the second maximum temperature to a predetermined threshold value; and
    operating the non-volatile storage system under the optimal performance profile.

2. The method of claim 1, wherein the optimal performance profile has a projected maximum temperature that is closest to the predetermined threshold value but not greater than the predetermined threshold value.

3. The method of claim 2, wherein the projected maximum temperature is obtained through interpolation or extrapolation of the first and second maximum temperatures.

4. The method of claim 1, wherein the set of performance profiles have different performance levels based on a common system performance benchmark.

5. The method of claim 4, wherein the common system performance benchmark is sequential read or sequential write, and the different performance levels are different speeds.

6. The method of claim 1, wherein the first performance profile has hardware component settings for a low performance level and the second performance profile has hardware component settings for a high performance level.

7. The method of claim 1, wherein the first and second maximum temperatures are obtained by a temperature sensor of the non-volatile storage system not located on a storage system controller, and the predefined temperature threshold is 85° C.

8. The method of claim 1, wherein the first and second maximum temperatures are obtained by a temperature sensor of the non-volatile storage system located on a storage system controller, and the predefined temperature threshold is 105° C.

9. The method of claim 1, wherein the thermal calibration is performed during initialization of the non-volatile storage system.

10. The method of claim 1, wherein the thermal calibration is triggered by a temperature reading of the non-volatile storage system reaching the predetermined threshold value, or one occurrence of thermal throttling, or a predetermined number of occurrences of thermal throttling during a given period of time.

11. The method of claim 1, wherein operating the non-volatile storage system under the optimal performance profile prevents thermal throttling or minimizes a probability of thermal throttling.

12. A non-volatile storage system, comprising:
a storage controller; and
a temperature sensor, wherein the storage controller is configured to:
generate a set of performance profiles, each of the set of performance profiles including settings for hardware components of the non-volatile storage system;
perform a thermal calibration by running a first test under a first performance profile and a second test under a second performance profile;
obtain a first maximum temperature under the first performance profile and a second maximum temperature under the second performance profile from readings of the temperature sensor;
select an optimal performance profile from the set of performance profiles based on comparing the first maximum temperature and the second maximum temperature to a predetermined threshold value; and
operate the non-volatile storage system under the optimal performance profile.

13. The non-volatile storage system of claim 12, wherein the optimal performance profile has a projected maximum temperature that is closest to the predetermined threshold value but not greater than the predetermined threshold value.

14. The non-volatile storage system of claim 13, wherein the projected maximum temperature is obtained through interpolation or extrapolation of the first and second maximum temperatures.

15. The non-volatile storage system of claim 12, wherein the set of performance profiles have different performance levels based on a common system performance benchmark.

16. The non-volatile storage system of claim 15, wherein the common system performance benchmark is sequential read or sequential write, and the different performance levels are different speeds.

17. The non-volatile storage system of claim 12, wherein the first performance profile has hardware component settings for a low performance level and the second performance profile has hardware component settings for a high performance level.

18. The non-volatile storage system of claim 12, wherein the temperature sensor of the non-volatile storage system is located off the storage system controller, and the predefined temperature threshold is 85° C.

19. The non-volatile storage system of claim 12, wherein the temperature sensor is located on the storage controller, and the predefined temperature threshold is 105° C.

20. The non-volatile storage system of claim 12, wherein the thermal calibration is triggered by a temperature reading of the non-volatile storage system reaching the predetermined threshold value, or one occurrence of thermal throttling, or a predetermined number of occurrences of thermal throttling during a given period of time.

21. A non-transitory machine-readable medium having executable instructions, wherein the executable instructions, when executed by a storage controller of a non-volatile storage system, causes the storage controller to:
generate a set of performance profiles, each of the set of performance profiles including settings for hardware components of the non-volatile storage system;
perform a thermal calibration by running a first test under a first performance profile and a second test under a second performance profile;
obtain a first maximum temperature under the first performance profile and a second maximum temperature under the second performance profile from readings of a temperature sensor of the non-volatile storage system;
select an optimal performance profile from the set of performance profiles based on comparing the first maximum temperature and the second maximum temperature to a predetermined threshold value; and
operate the non-volatile storage system under the optimal performance profile.

22. The non-transitory machine-readable medium of claim 21, wherein the thermal calibration is performed during initialization of the non-volatile storage system.

* * * * *